United States Patent
Horiuchi et al.

(10) Patent No.: US 7,705,327 B2
(45) Date of Patent: Apr. 27, 2010

(54) BEAM SHOT POSITION CORRECTION COEFFICIENT COMPUTATION/UPDATING TECHNIQUE FOR ULTRAFINE PATTERN FABRICATION USING VARIABLE SHAPED BEAM LITHOGRAPHY

(75) Inventors: Tomoyuki Horiuchi, Shizuoka (JP); Noriaki Nakayamada, Santa Clara, CA (US); Junichi Suzuki, Saitama (JP); Takeshi Kurohori, Shizuoka (JP)

(73) Assignee: NuFlare Technology, Inc., Numazu-shi (JP)

( * ) Notice: Subject to any disclaimer, the term of this patent is extended or adjusted under 35 U.S.C. 154(b) by 312 days.

(21) Appl. No.: 11/850,904

(22) Filed: Sep. 6, 2007

(65) Prior Publication Data

US 2008/0078947 A1    Apr. 3, 2008

(30) Foreign Application Priority Data

Sep. 28, 2006  (JP)  ............................. 2006-264190

(51) Int. Cl.
*H01J 37/00*  (2006.01)
(52) U.S. Cl. .............. 250/492.2; 250/491.1; 250/396 R
(58) Field of Classification Search .................. 430/30, 430/296, 297, 298, 299; 250/306, 307, 309, 250/310, 311, 396 R, 397, 491.1, 492.1, 492.2, 250/492.21, 492.22, 492.23, 492.3, 398; 355/52, 53; 356/399
See application file for complete search history.

(56) References Cited

U.S. PATENT DOCUMENTS

| | | | | |
|---|---|---|---|---|
| 5,047,647 | A | * | 9/1991 | Itoh et al. ................. 250/491.1 |
| 5,777,747 | A | * | 7/1998 | Tanaka ........................ 356/401 |
| 5,798,528 | A | * | 8/1998 | Butsch et al. ............. 250/492.2 |
| 2009/0153817 | A1 | * | 6/2009 | Kawakubo .................... 355/53 |

FOREIGN PATENT DOCUMENTS

JP        9-330867        12/1997

* cited by examiner

*Primary Examiner*—Jack I Berman
*Assistant Examiner*—Nicole Ippolito Rausch
(74) *Attorney, Agent, or Firm*—Oblon, Spivak, McClelland, Maier & Neustadt, L.L.P.

(57) ABSTRACT

A charged-particle beam lithography apparatus includes a charged-particle beam irradiation unit, a deflector which deflects the charged particle beam, a stage which disposes thereon a workpiece for pattern writing and a plurality of marks being regularly laid out in an entire area substantially equal to a pattern writing region of the workpiece, a measurement unit for measuring positions of the marks on the stage through scanning of the charged-particle beam by the deflector, a coefficient calculation unit which uses an approximation equation for correction of a position deviation occurring due to a hardware configuration of the apparatus to perform the fitting of a position deviation amount of each mark by a coordinate system of the apparatus to thereby calculate more than one coefficient of the fitting-applied approximation equation, and a storage unit which performs overwrite-storing whenever the coefficient calculation unit calculates the coefficient.

6 Claims, 16 Drawing Sheets

BEFORE UPDATE

AFTER UPDATE

Related Art

BEAM SHOT POSITION CORRECTION COEFFICIENT COMPUTATION/UPDATING TECHNIQUE FOR ULTRAFINE PATTERN FABRICATION USING VARIABLE SHAPED BEAM LITHOGRAPHY

CROSS-REFERENCE TO RELATED APPLICATION

This application claims priority to Japanese Patent Application No. 2006-264190, filed Sep. 28, 2006, the disclosure of which is incorporated herein by reference.

FIELD OF THE INVENTION

The present invention relates generally to charged-particle beam lithography technologies and, more particularly, to beam irradiation position correcting coefficient computing and updating techniques adaptable for use in charged-particle beam lithographic apparatus. This invention also relates to on-workpiece beam shot position correcting methods for use in variable-shaped electron beam lithography systems.

DESCRIPTION OF RELATED ART

Lithography technology is devoted to advances in semiconductor device miniaturization and is a very important process among semiconductor device fabrication processes as the lithography has its unique nature of integrated circuit pattern creation and production. In recent years, as large-scale integrated (LSI) semiconductor devices increase in integration density, circuit linewidths required for such devices decrease year by year. In order to form a desired circuit pattern on these semiconductor devices, a high-accuracy original or "master" image pattern, also called the reticle or photo-mask is needed. Electron beam (EB) lithography techniques inherently offer superior image resolutions and are thus used in the manufacture of the high-accuracy master pattern.

A beam irradiation part employed in one prior known variable-shaped EB lithography apparatus is shown in FIG. 14 in perspective diagram form. A structure and operation of this EB lithography tool are as follows. The beam optics includes an electron source 430 which emits an electron beam, a first aperture plate 410 having a rectangular opening 411, and a second aperture plate 420 having a variable shaping hole 421 for variably shaping the beam 330 that passed through the aperture opening 411 into a desired rectangular shape. The shaped beam 330 is then deflected by a deflector (not shown) so that it passes through part of the variable shaping hole 421 and is finally irradiated or "shot" onto a target workpiece 340, which is stably mounted on a stage structure (not shown). This stage is continuously movable in a predetermined direction (e.g., X-axis direction) during pattern writing. In short, a rectangular cross-section part of the write beam that can pass through both the aperture opening 411 and the variable shaping hole 421 is guided to fall onto a pattern writing surface area of the workpiece 340 on the continuously movable stage to thereby write or "draw" a desired circuit pattern thereon. This kind of pattern writing scheme is known as the variable-shaped beam (VSB) lithography.

In VSB lithography tools of the type stated above, size/dimension accuracy and beam shot position accuracy are important factors. In view of this, one typical approach to correcting or "amending" the coordinate system of EB tool to the ideal coordinate system is to perform a process having the steps of subdividing an entire surface of a workpiece for pattern writing into a matrix of rows and columns—say, meshes—each having a predefined grid size, measuring the position of crossing points of respective meshes, and then correcting the coordinate system of EB tool based on differences or errors between the measured positions and the initially designed positions. This functionality is called the grid matching correction (GMC). More specifically, a pattern for the GMC measurement use is lithographically created at a position corresponding to each mesh's crossing point in a resist-deposited mask blank area. Then, after having performed development and etching of such mask, position accuracy measurement is done using the pattern. The resulting measurement result is used to correct the coordinate system of the EB tool.

The GMC typically includes third-order polynomial equation-based correction and map correction using a set of polynomial equation coefficients (correction coefficients) and a correction map, which are initially determined upon activation of EB tool. While respective constituent parts making up EB tool are fastened by screwing or epoxy resin adhesion, these exhibit change with time or "aging" so that the once-setup correction coefficients can vary over time. This results in the EB tool's coordinate system being deviated from its ideal coordinate system, causing the position accuracy to decrease accordingly. The with-time position deviation problem is becoming more serious in advanced VSB lithography as the integrated circuit linewidth shrinks in recent years, although it has long been ignorable in practical applications in the past.

One prior known approach to correcting deviations in coordinate system of the apparatus subject to aging is to perform calibration of each beam once per exposure in a multi-beam EB lithography system, as disclosed for example in JP-A-9-330867. This technique as taught therefrom uses a group of marks or Faraday cup disposed at a single position on a stage. By irradiating a beam thereonto, perform position measurement to thereby determine the relationship between the measured position and its inherently designed position, which is then used to make the beam coordinate system identical to deflection coordinate system. Unfortunately, the position accuracy can vary in a way depending upon inplane positions on the surface of a mask being subjected to pattern writing, so mere measurement of one-point position makes it difficult to correct the coordinate system successfully.

It has been stated that the amount of EB tool's position deviation caused by unwanted offsets from the ideal coordinate system due to the with-time change or "aging" of hardware apparatus structure poses a problem as to decrease in accuracy of highly integrated circuit patterns as their minimum feature sizes continue to shrink in year by year. See FIG. 15, which shows a with-time change of the orthogonality of one prior known pattern-writing area, an entirety of which is divided into a matrix or "mesh" 31 of rows and columns of square unit regions with a prespecified grid size, wherein respective "meshes" indicate pattern writing positions. Upon power-up of EB tool, the mesh 31 has an accurate orthogonal coordinate system which is corrected by a set of initially determined polynomial equation coefficients (correction coefficients) and an initially defined correction map. However, due to possible changes in EB tool's hardware structure with the elapse of days or months, the mesh 31 is becoming deformed into a parallelogram-like mesh 32 and then into a rhombic mesh 33. Obviously, the orthogonality is becoming collapsed in this order of sequence as time passes.

See FIG. 16, which graphically shows exemplary with-time changes of the coordinate system orthogonality. In this graph, orthogonality changes are measured and plotted for six kinds of layout patterns that are lithographically created by EB tool. It can be seen that each layout pattern changes in orthogonality with the elapse of days. At a time point after elapse of 180 days (about six months) since activation of EB tool, the initially determined correction coefficients and map are updated in value. With this updating, the orthogonality once recovers its initial form and remains it within a certain length of time period; however, the orthogonality will again become collapsed as days go by.

This demonstrates that it is a must to perform iteratively the updating of GMC coefficients at shortened time intervals in order to maintain the position accuracy required. As previously stated, the position accuracy determination includes many time-consuming steps of writing GMC measurement-use patterns on a target mask in resist-deposited mask blanks thereof, applying necessary process treatments to the resultant mask, performing measurement of the real position accuracy using the actually written patterns, and then newly computing an updated version of the GMC coefficients. This troublesome procedure takes much time—perhaps, two days or more. Frequently performing such time-consuming measurement-based GMC coefficient computation process at shortened time intervals must be a serious bar to achievement of higher fabrication efficiency, which is the issue of vital importance for leading-edge semiconductor device manufacturers.

BRIEF SUMMARY OF THE INVENTION

It is therefore an object of this invention to provide a method capable of shortening the length of a time to be consumed to calculate correction coefficients and also a method for updating the correction coefficients.

In accordance with one aspect of this invention, a charged-particle beam lithography apparatus is provided, which includes an irradiation unit operative to irradiate a charged-particle beam, a deflector for deflecting the beam, a stage which disposes thereon a workpiece for pattern writing and a plurality of marks being regularly laid out in an entire area substantially equal to a pattern writing region of the workpiece, a measurement unit for measuring positions of the marks on the stage through scanning of the beam by the deflector, a coefficient calculation unit which uses an equation of approximation for correction of a position deviation occurring due to a hardware configuration of the lithography apparatus to perform the fitting of a position deviation amount of each mark by a coordinate system of the apparatus to thereby calculate more than one coefficient of the approximation equation with the fitting applied thereto, and a storage unit which performs overwrite storing whenever the coefficient calculation unit calculates the coefficient.

In accordance with another aspect of the invention, a position correction coefficient calculation method of a charged particle beam lithography apparatus for calculating more than one coefficient of an approximation equation used to correct a position deviation occurring due to a hardware configuration of the lithography apparatus is provided. This method includes the steps of scanning by use of a charged particle beam a plurality of marks which are regularly disposed in an entire area equivalent to a pattern writing region of a workpiece for pattern writing on a stage, performing the fitting of a position deviation amount of each scanned mark by a coordinate system of the lithography apparatus to thereby calculate more than one coefficient of the approximation equation with the fitting applied thereto, and then outputting the coefficient calculated.

In accordance with a further aspect of the invention, a position correction coefficient updating method of a charged particle beam lithography apparatus for updating more than one coefficient of an approximation equation being stored in a storage device is provided. The coefficient is for correction of a position deviation occurrable due to a hardware configuration of the lithography apparatus. The method includes the steps of scanning using a charged particle beam a plurality of marks being regularly disposed in an entire area corresponding to a pattern writing region of a workpiece for pattern writing on a stage, performing the fitting of a position deviation amount of each scanned mark by a coordinate system of the lithography apparatus to thereby calculate more than one coefficient of the approximation equation with the fitting applied thereto, and overwriting the calculated coefficient on a previously defined coefficient being stored in the storage device.

DETAILED DESCRIPTION OF THE INVENTION

In variable-shaped beam (VSB) ultrafine-pattern lithography apparatus and methodology incorporating the principles of this invention as described herein, an electron beam is used as an example of a charged-particle beam, although other similar suitable energy beams are alternatively employable, such as an ion beam, etc.

Embodiment 1

Figure 1:
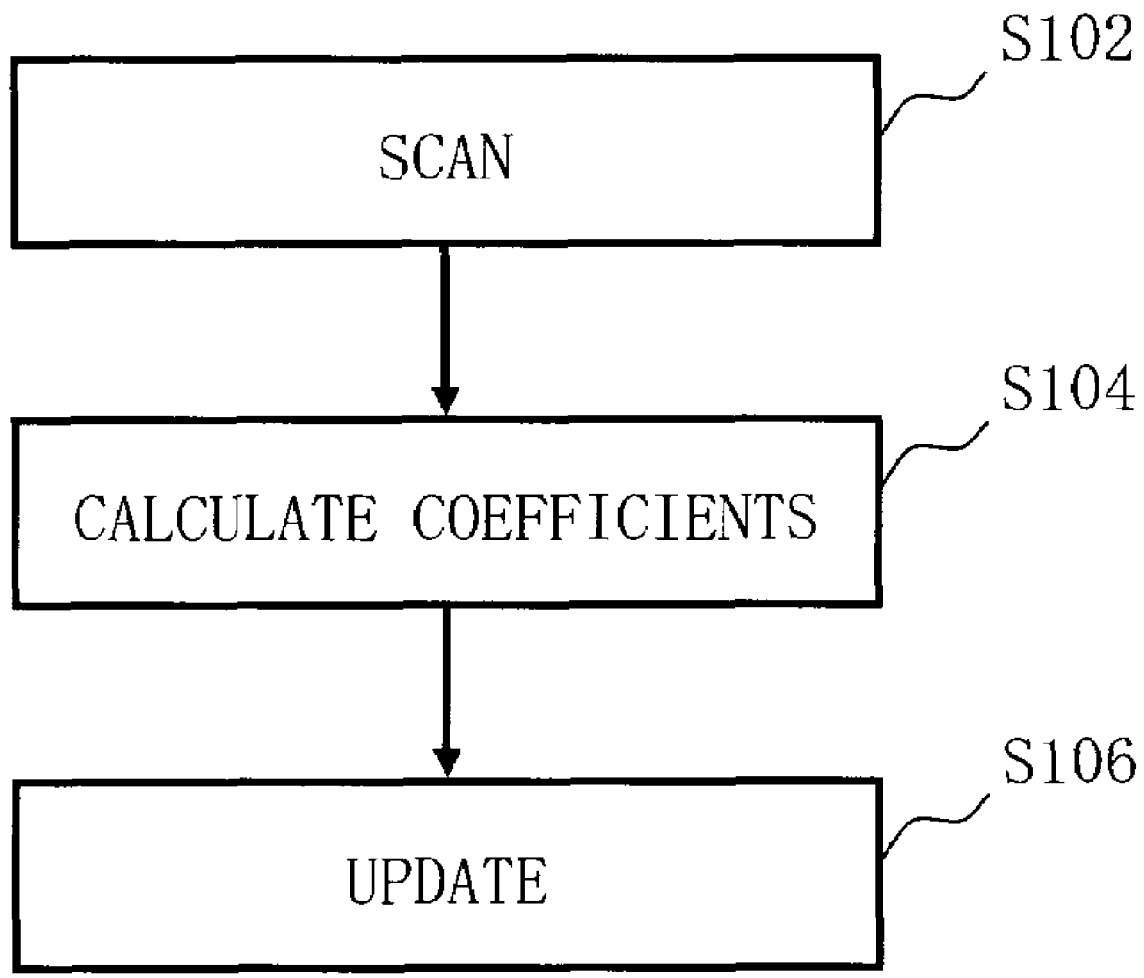
FIG. 1 is a flow diagram showing major process steps of a position correction coefficient calculation/updating method for use in a lithography apparatus in accordance with an embodiment of this invention.

Referring to FIG. 1, there is shown a flow chart of major process steps of a position correction coefficient computation/updating method adaptable for use in VSB lithography apparatus. As shown herein, this method includes a series of three main steps, i.e., scanning step S102, coefficient calculation step S104, and position correction coefficient updating step S106. Detailed explanations of these steps will be given later in the description.

Figure 2:
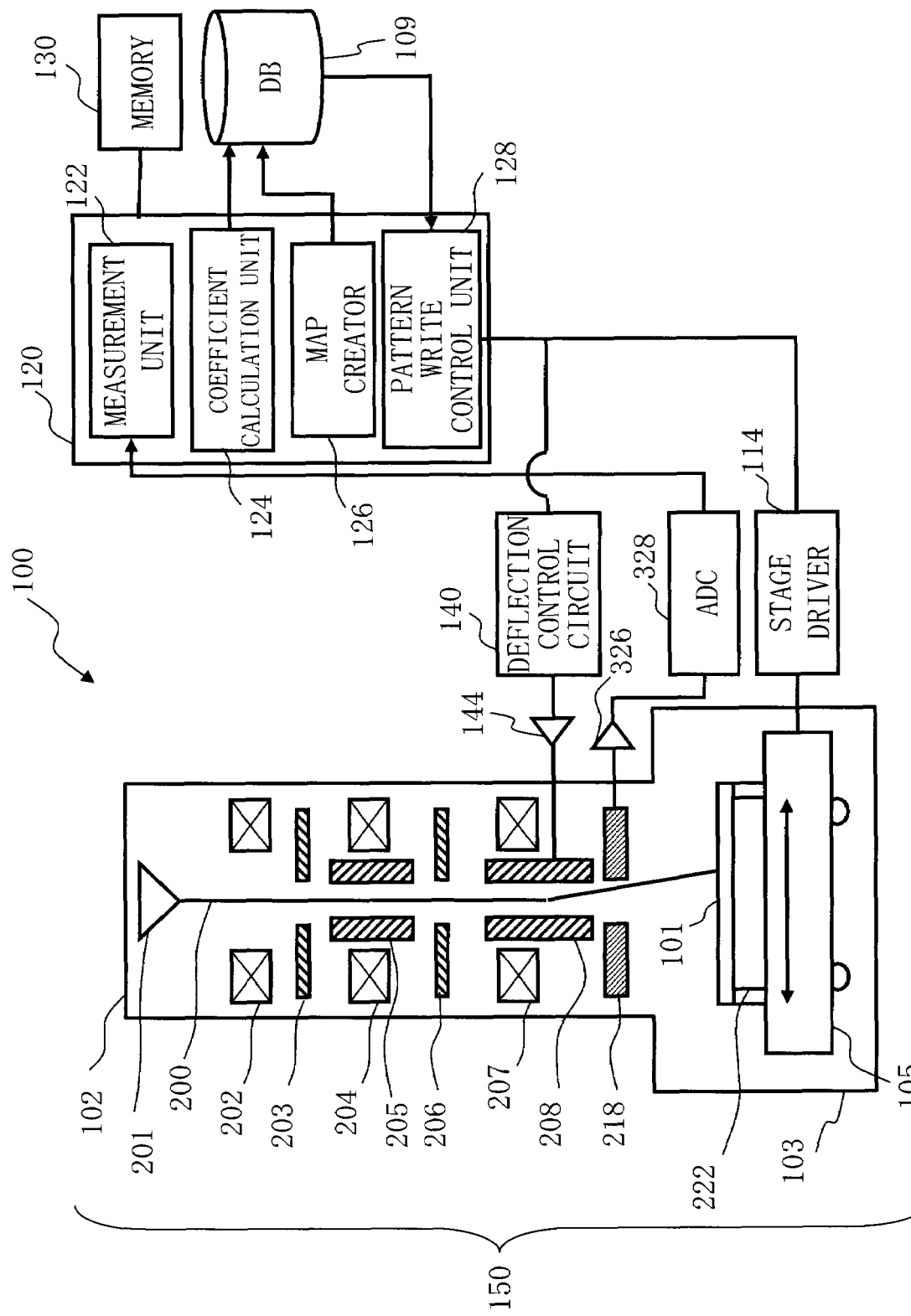
FIG. 2 is a diagram showing an overall configuration of the lithography apparatus embodying the invention.

Turning to FIG. 2, an overall system configuration of VSB lithographic apparatus 100 embodying the invention is shown. This lithography tool 100 includes a charged-particle beam pattern creation module 150 and a system control unit operatively associated therewith. An example of the pattern writer 150 is an electron-beam (EB) pattern writing unit. This EB pattern writer 150 is for drawing or writing a predetermined integrated circuit pattern on a target workpiece 101 being fabricated. An example of this workpiece is a photomask for use in the manufacture of ULSI semiconductor circuit devices. Pattern writer 150 has a tower of electron optical column 102 and a writing chamber 103. The electron optics tower 102 has therein a column of components, including an electron gun assembly 201, illumination lens 202, upper-level aperture plate 203, projection lens 204, upper deflector 205, lower aperture plate 206, objective lens 207, lower deflector 208, and electron detector 218. The writing chamber 103 includes an X/Y-axis stage structure 105. This XY stage 105 has its top surface on which positioning/securing pins 222 are laid out for stably holding the mask 101 as mounted thereon. The system controller includes a control computer 120, data storage memory 130, database (DB) unit 109, beam deflection control circuit 140, deflection amplifier 144, stage drive circuit 114, signal amplifier 326, and analog-to-digital converter (ADC) 328.

The control computer 120 has several functional units, including a measurement unit 122, coefficient calculation unit 124, map creation unit 126, and pattern-writing control unit 128. The memory 130 is for storage of information being input to control computer 120 and data being presently processed or processing result data in an event-sensitive manner.

The control computer 120 is operatively associated with the memory 130, deflection control circuit 140, DB unit 109, stage driver 114 and ADC 328, which are connected by a bundle of data transfer buses (not shown). Deflection controller 140 is connected via deflection amplifier 144 to deflector 208. ADC 328 is connected via amp 326 to detector 218.

While only those parts or components deemed essential to the description of EB lithography tool 100 are shown in FIG. 2, this EB tool may be designed to include other components. Additionally, although in FIG. 2 the control computer 120 is arranged to execute functions of the measurement unit 122, coefficient calculation unit 124, map creator 126 and pattern write control unit 128, these units may be designed by hardware devices, such as electrical or electronic circuits. These may alternatively be designed in combination with hardware and software programs or firmware modules.

A beam 200 of charged particles, e.g., electron beam, which is emitted from the electron gun 201 is guided by the illumination lens 202 to illuminate an entire surface of the upper aperture plate 203 having its rectangular opening 203. Here, the electron beam 200 is shaped to have a rectangular cross-section. The resulting aperture-image beam 200 that passed through aperture 203 is projected by projection lens 204 onto the lower aperture plate 206 at a position which is deflection-controlled by the deflector 205 so that its shape and size are altered. After having passed through lower aperture 206, the resultant aperture image beam 200 is subjected to focus adjustment by the objective lens 207 and then deflected by lower deflector 208 to fall onto the mask 101 situated on XY stage 105 at a desired position on the mask surface. Deflector 208 is controlled by deflector control circuit 140 whereas XY stage 105 is under control of the stage driver circuit 114.

Figure 3:
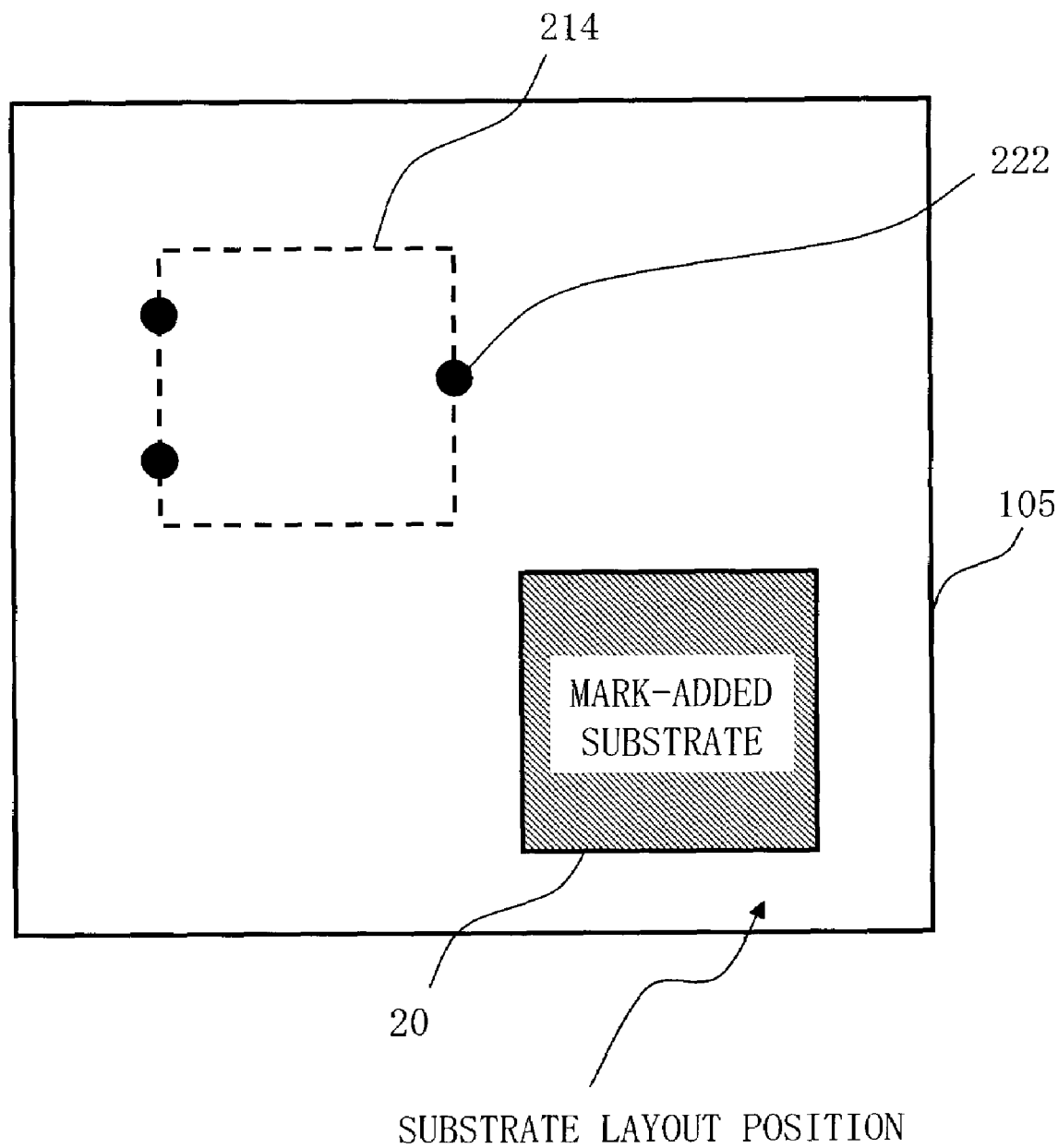
FIG. 3 depicts a top plan view of an X-Y stage in the embodiment lithography apparatus.

As shown in a plan view of FIG. 3, the XY stage 105 has three upstanding securement pins 222 which are laid out on its top surface for defining a mask layout position 214 to thereby stably hold therein the mask 101 being fabricated. At another location on the XY stage surface, a half-etch substrate 20 is disposed so that it does not overlap the mask layout position 214. This half-etch substrate 20 is used for measurement of respective positions in the pattern writing area of mask 101 in a way as will be described in detail later. Positioning half-etch substrate 20 at a different position from mask layout position 214 on XY stage 105 ensures that no disturbances are given to pattern write operation of mask 101. Optionally, letting half-etch substrate 20 be disposed as occasion arises eliminates troublesome works of loading it onto XY stage 105, one at a time, whenever the mask is replaced with another. This reduces a time taken for such loading. Note that the XY stage structure of FIG. 3 is only for illustration purposes of the embodiment, and other known associative parts may be added thereto on a case-by-case basis.

Figure 4:
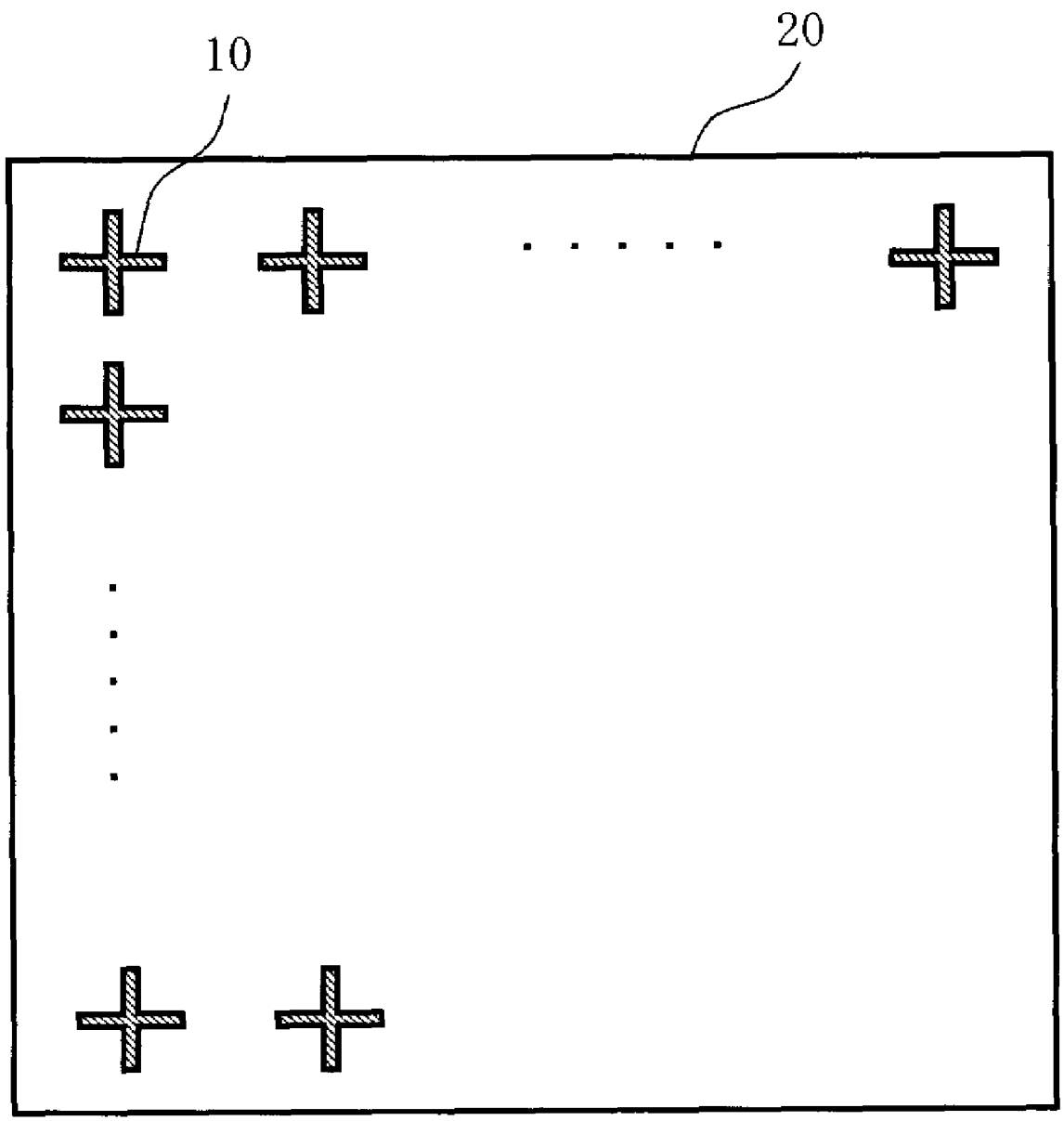
FIG. 4 shows a plan view of one exemplary half-etch substrate used in the embodiment apparatus.

As shown in FIG. 4, the half-etch substrate 20 is arranged to be identical in size dimensions to the mask 101 on XY stage 105 or, alternatively, to the pattern write area of mask 101. Half-etch substrate 20 has an array of rows and columns of cross-like markings 10, which are laid out at equal spatial intervals in an entire region corresponding to the mask's pattern write area. Using this uniform layout of marks 10 covering the entire region permits successful measurement of the amount of a position deviation at almost any location on the surface.

Figure 5:
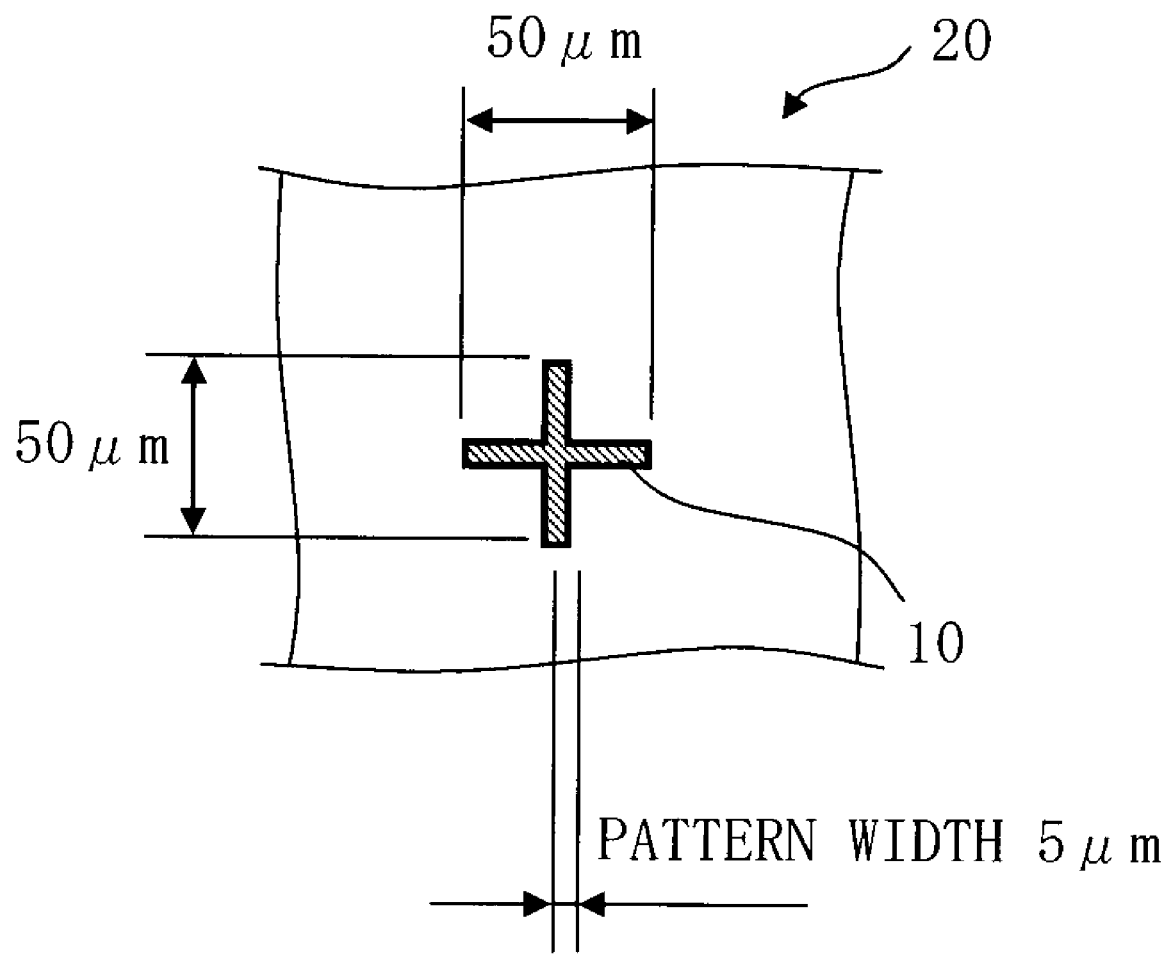
FIG. 5 is a pictorial representation of an exemplary mark for use in the embodiment.

As shown in FIG. 5, the cross-like marks 10 are arranged so that each is 5 micrometers (μm) in pattern width and 50 μm in length of upright and transverse bars. These size values are exemplary and may be modifiable pro re nata.

Figure 6:
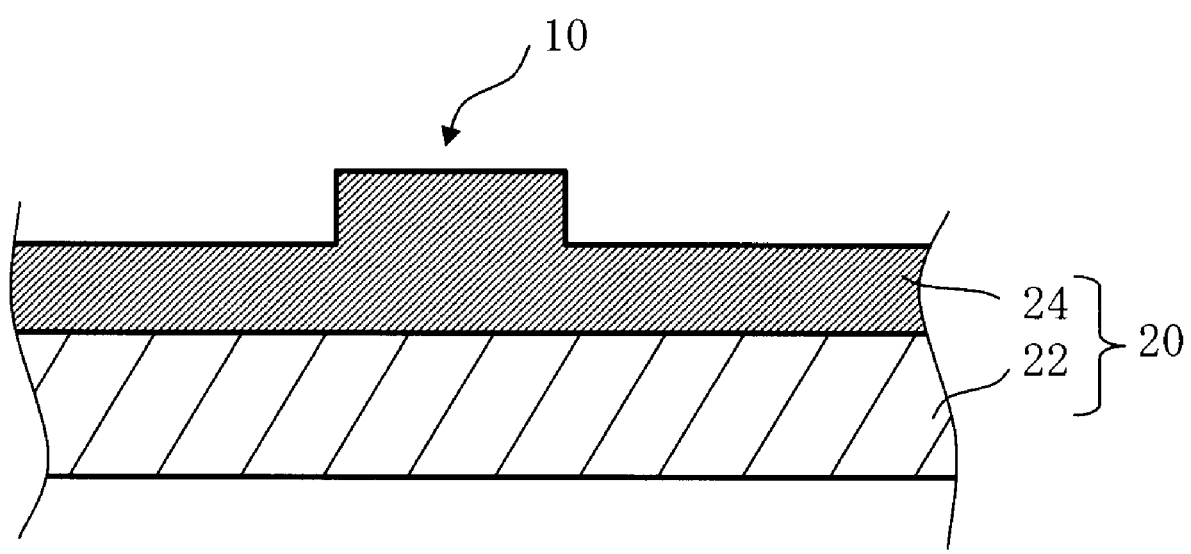
FIG. 6 shows a cross-sectional view of main part of a half-etch substrate employable in the embodiment.

As shown in a sectional diagram of FIG. 6, the half-etch substrate 20 has an optically transparent substrate 22 made of, for example, glass material, having a surface on which a patterned metal film 24 is formed. This film may be made of chromium (Cr), which is photolithographically formed and selectively etched by known etching techniques to have on its surface a pattern of projections corresponding to the array of cross marks 10 stated supra. Upon direct hitting of electron beam 200 on glass substrate 22, this substrate can experience degradation or deterioration. This is avoidable by designing substrate 20 to have the half-etched structure, even when driving electron beam 200 to scan base film portions around cross marks 10. Thus, one piece of half-etch substrate 20 is usable repeatedly for more than two pattern writing sessions. Obviously, this enables repeated execution of mark position measurement within a short length of time period. Additionally, when the need arises, the cross marks 10 may be designed as patterning-formed recesses or dimples, rather than projections shown in FIG. 6.

Using the half-etch substrate 20, EB tool position correction coefficient computation and updating are executed in a way which follows.

The procedure starts with step S102 of FIG. 1, which causes EB tool 100 to use an electron beam 200 to scan the entire surface area of half-etch substrate 20 corresponding to the pattern write area of the mask 101 on XY stage 105, more precisely, scan the matrix array of equally spaced cross-like marks 10 thereon.

Figure 7:
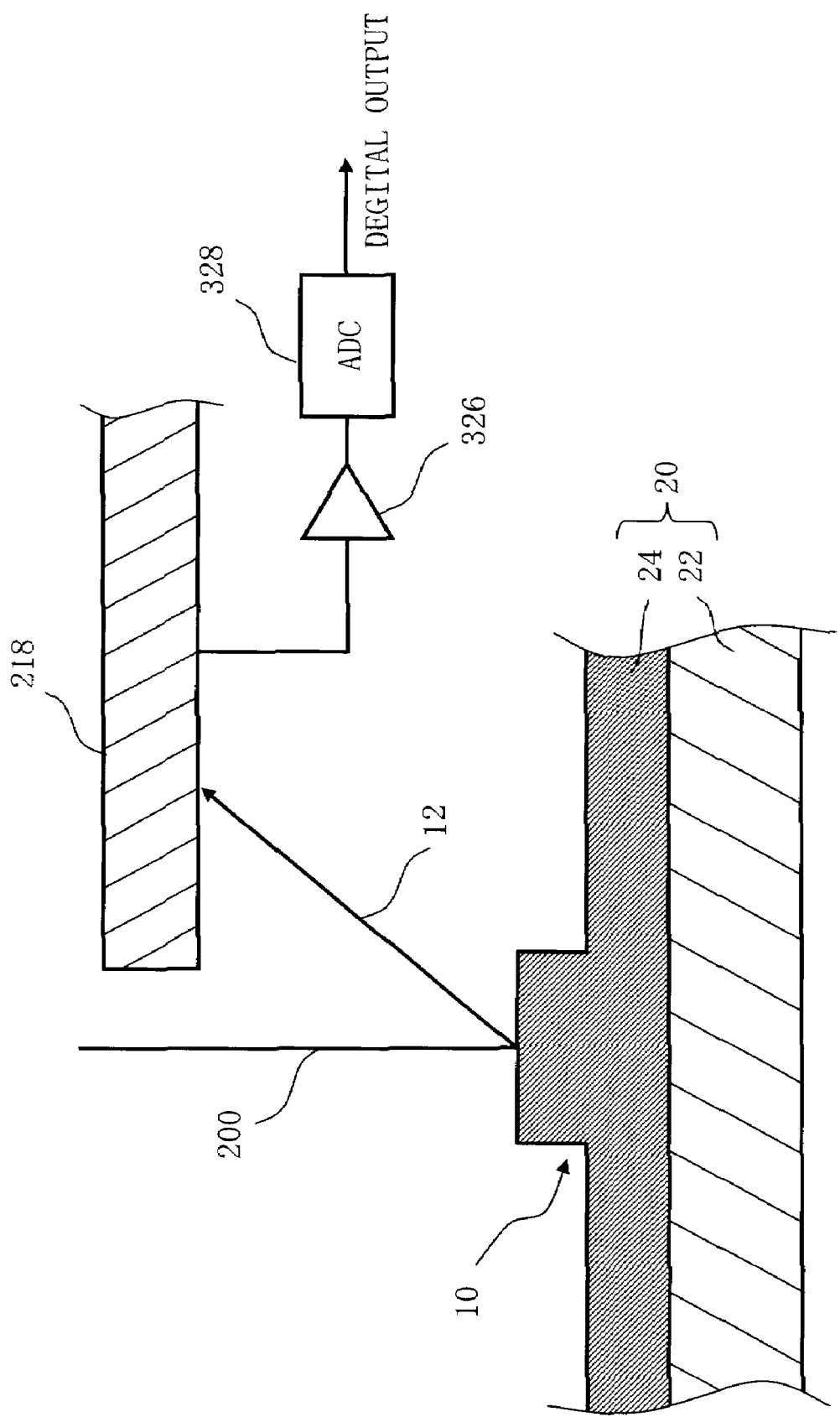
FIG. 7 is a pictorial representation of a process of measuring reflection electrons in the embodiment.

At the beginning of this scan step S102, the XY stage 105 is previously adjusted in position so that it moves to a position which permits the rectangularly shaped electron beam 200 to fall onto half-etch substrate 20. Then, as shown in FIG. 7, scan the beam 200 so that it comes closer to one of the cross marks 10 on substrate 20. Upon hitting of beam 200 at mark 10, reflection electrons 12 are given off from Cr film 24. These electrons 12 reach the detector 218. This detector senses them to generate at its output an electrical analog detection signal, which is amplified by the amplifier 326 and then converted by ADC 328 into a digital signal for transmission to measurement unit 122. Recall here that the half-etch substrate 20's Cr film 24 is variable in thickness—that is, its thickness is different between at cross marks 10 and at the remaining base film portions. This thickness difference derives a likewise difference in detection signal intensity between marks 10 and the base film portions. Based on such difference, measurement unit 122 measures the exact position of each mark 10. The scanning of electron beam 200 is performed by beam deflection using deflector 208.

Figure 8:
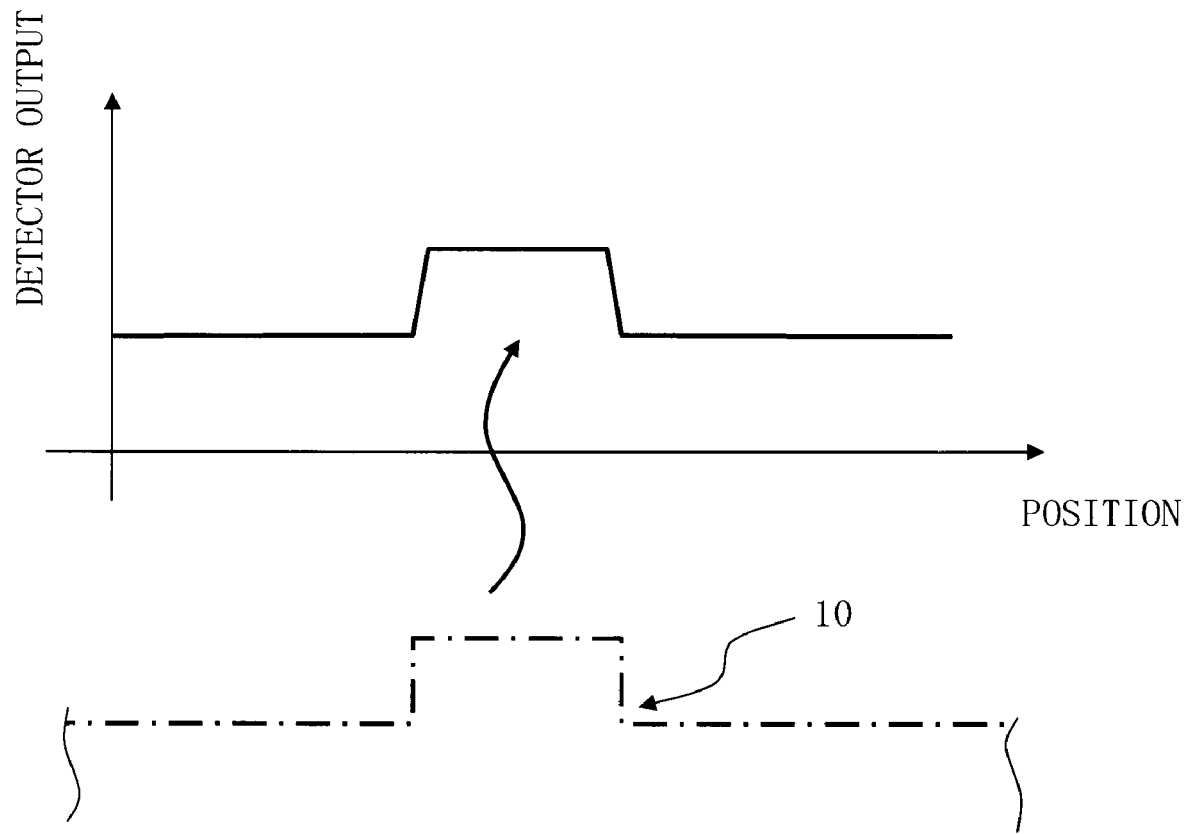
FIG. 8 is a waveform diagram of a detection output signal in the embodiment.

An exemplary waveform of the detection signal as output from the detector 218 is shown in FIG. 8. As shown herein, at any one of the marks 10 of half-etch substrate 20, the detection output becomes greater than those at the other portions, resulting in the detection signal having an almost rectangular waveform corresponding to the cross-section of each mark.

The above-noted beam scanning operation will be repeated for every mark 10, thereby to measure the positions of respective marks 10 on half-etch substrate 20.

Figure 9:
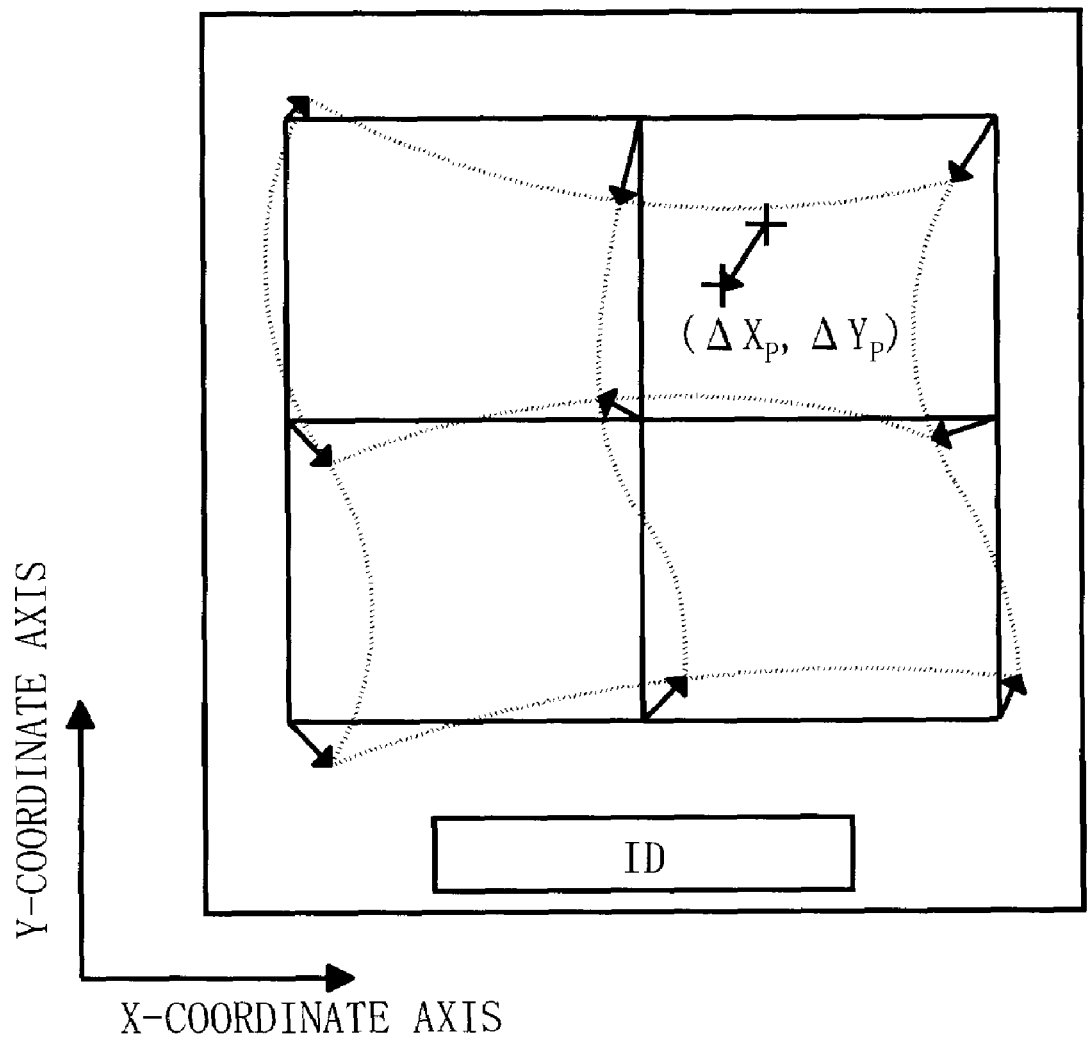
FIG. 9 is a diagram showing an exemplary map of mark positions in the embodiment.

An exemplary map of the mark positions thus measured is shown in FIG. 9. A map of the ideal system of X and Y coordinates is indicated by solid lines, whereas the map of actually measured positions of cross marks 10 on half-etch substrate 20 is indicated by dotted lines. As apparent from comparison of these maps, the measured mark position map is deformed due to the presence of distortions relative to the ideal map, wherein arrows are used to indicate position deviation vectorial quantities each connecting together an ideal coordinate position and its corresponding measured position. Such measured positions also involve distortions occurring due to unwanted aberrations of stage coordinates, corruption of the orthogonality, and curvature of a stage position-measuring mirror(s). While in the map of FIG. 9 the measurement points are set to nine points, i.e., a matrix of three rows and three columns of inplane positions, more positions may be used for the measurement. An example is that the measurement points are made equal in number to the cross marks 10 of half-etch substrate 20.

Note here that the number of the cross marks 10 on half-etch substrate 20 under position measurement may be determined in a way depending on the accuracy required. In most cases, use of more than nine (three by three) points is deemed preferable. Additionally in case the objective deflector 208 shown in FIG. 2 is replaced by a two-stage deflector assembly having main and subsidiary deflectors, it is more desirable that a specific number of marks 10 be provided on half-etch substrate 20, which number is equal to the number of main deflection positions.

Then, the procedure of FIG. 1 goes to step S104, which causes the coefficient calculation unit 124 to perform fitting of the position deviation amounts or "offsets" of respective marks 10 by the EB tool's own coordinate system to thereby determine through computation the coefficients of an approximation equation with the fitting applied thereto.

A positional offset of each mark 10 in X direction, $\Delta X_p$, can be subjected to fitting by Equation (1) which follows:

$$\Delta X_p = a_0 + a_1 \cdot x + a_2 \cdot y + a_3 \cdot x^2 + a_4 \cdot x \cdot y + \\ a_5 \cdot y^2 + a_6 \cdot x^3 + a_7 x^2 \cdot y + a_8 \cdot x \cdot y^2 + a_9 \cdot y^3 \quad (1)$$

Similarly, the fitting of position offset of each mark 10 in Y direction, $\Delta Y_p$, is performed by Equation (2) below:

$$\Delta Y_p = b_0 + b_1 \cdot x + b_2 \cdot y + b_3 \cdot x^2 + b_4 \cdot x \cdot y + \\ b_5 \cdot y^2 + b_6 \cdot x^3 + b_7 \cdot x^2 \cdot y + b_8 \cdot x \cdot y^2 + b_9 \cdot y^3 \quad (2)$$

The position offset of each mark 10 scanned by tertiary or cubic function (approximate expression) having as its variables X-Y coordinates in the EB tool's coordinate system being set to the ideal coordinate system using least-squares methods is subjected to the fitting by use of Equations (1) and (2) stated above. This fitting is performed with respect to each of the X and Y directions, thereby to obtain the fitting-applied approximation equation coefficients $a_0$ to $a_9$ in the X direction and fitting-applied approximation equation coefficients $b_0$ to $b_9$ in Y direction. These coefficients $a_0$-$a_9$ and $b_0$-$b_9$ are for later use as the position correction coefficients, i.e., grid matching correction (GMC) coefficients, for correcting any position offsets occurrable due to the hardware structure of EB tool 100.

Figure 10:
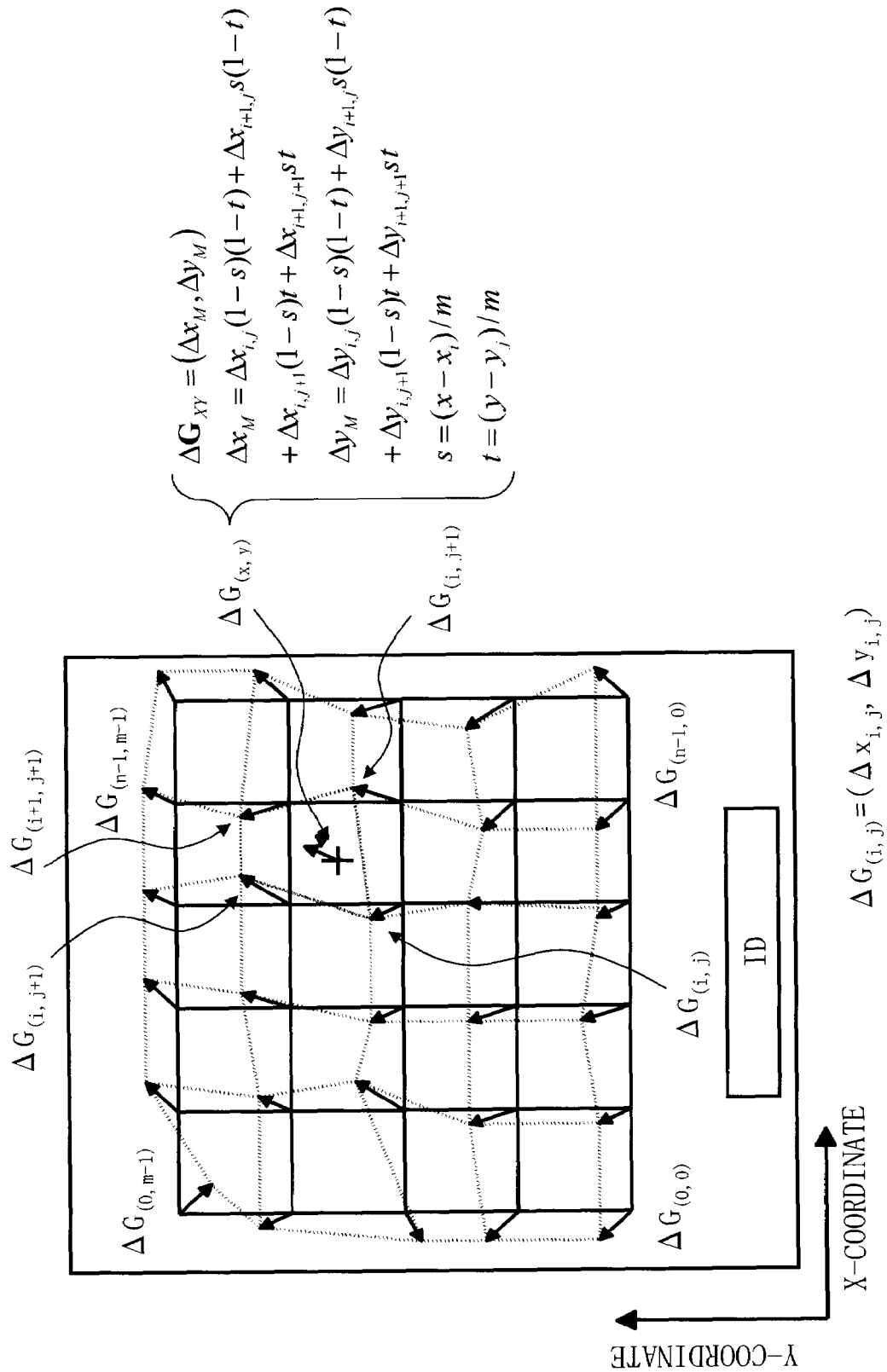
FIG. 10 shows another exemplary map of mark positions in the embodiment.

Another example of the mark position map in the case of a matrix of five rows and six columns of measurement points, i.e., thirty points in total, is shown in FIG. 10. As in the example of FIG. 9, the map of actually measured positions of marks 10 is deformed as indicated by dotted lines to have distortions relative to the ideal coordinate system map indicated by solid lines. Here, arrows are used to indicate position offsets (vectorial quantities) each connecting together an ideal coordinate position and its corresponding measured position in a similar way to the example of FIG. 9. The measured positions also contain distortions occurring due to unwanted aberrations of stage coordinates, corruption of the orthogonality, and curvature of a stage position-measuring mirror(s). In the case of the above-noted cubic polynomial equations being used, map-based correction is deemed effective when all the position offsets are incapable of being corrected together at a time. In light of this fact, the correction map shown in FIG. 10 is prepared by the map creator 126 used for correction of position offsets from the EB tool's coordinate system. A position offset amount $\Delta G(x,y)$ at a given coordinate position (x,y) is obtainable through interpolation of positional deviations $\Delta G$ of four separate measurement points (i,j) around the coordinate point (x,y) as shown in FIG. 10, where "i" and "j" are the measurement point coordinates.

Then, as shown in FIG. 1, the routine goes to step S106 which causes the coefficient calculation unit 124 to store the newly calculated coefficients in DB 109 in such a way as to overwrite them on the previously obtained "old" coefficients being stored therein. Thus GMC coefficients are updated to the latest ones. As DB 109 also stores the correction map, the map creator 126 saves the newly prepared correction map in DB 109 to thereby overwrite its previous correction map. With this procedure, the correction map also is updatable. A new version of GMC coefficients are stored by overwriting in DB 109, one at a time, whenever coefficient calculation unit 124 calculates them. Similarly, a new correction map is stored by overwrite in DB 109 whenever map creator 126 makes them in a session-sensitive way.

Thereafter, the pattern write control unit 128 reads out of the DB 109 the latest version of GMC coefficients and correction map and then generates at its output a deflection control signal for deflecting the electron beam 200 to a deflection position that is properly corrected by the deflection control circuit 140. Simultaneously, controller 128 generates and supplies to stage driver circuit 114 a drive signal for forcing XY stage 105 to move to a corrected position.

After having corrected the EB tool coordinate system in the way stated above, the electron beam 200 is irradiated or "shot" onto the mask 101 on XY stage 105.

Figure 11:
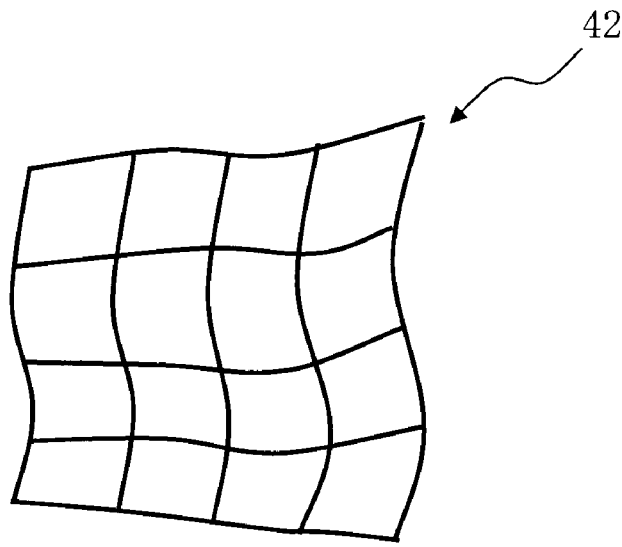
FIG. 11 shows a distorted mesh pattern of image writing positions and an amended version of the mesh pattern, which are before and after correction coefficient updating.
Figure 11:
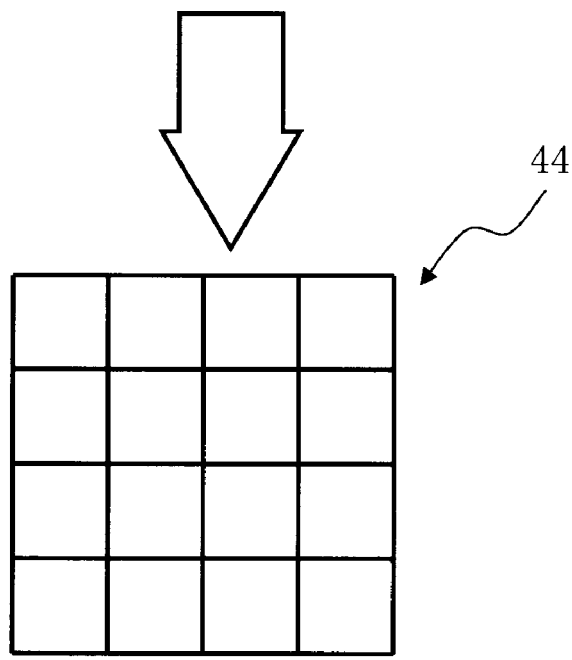

An exemplary distorted mesh-divided pattern-writing positions 42 of mask 101 is pictorially shown in FIG. 11, along with a corrected/updated mesh 44 thereof. While the before-update mesh 42 is the one resulted from mere correction of pattern write positions using not-updated or "old" GMC coefficients irrespective of the fact that it is changed with time and thus has appreciable distortions, performing the updating of GMC coefficients at prespecified length of time intervals makes it possible to eliminate such distortions at pattern write positions as well demonstrated by a sketch of the after-update mesh 44 with adequately corrected regular orthogonal coordinate system. The length of time interval for GMC coefficient correction is preferably set to about six moths or less—more preferably, the correction is done once per day.

In cases where the GMC coefficient correction/updating time interval is longer than one day, e.g., one month (once per month), it is also preferable to employ a scheme which follows: obtain a per-day change amount averaged from a with-time change in position offset; then, based on the per-day change amount, update GMC coefficients and correction map every day. One recommendable approach to doing so is to tie together the previously measured position points and those measured one month later by line segments respectively, divide the length of individual line segment by an integer indicative of the number of days of a month—e.g., 28, 29, 30 or 31—and then determine the resulting division result to be a per-day change value.

Although in this embodiment the correction map is also updated along with the GMC coefficients, execution of correction based on the polynomial equations only is permissible in some cases. Alternatively, mere map-based correction is permissible in other cases. Nevertheless, in most cases, using the both is more preferable for practical implementation of the invention.

It has been stated that in this embodiment, it is possible to compute in a short period of time the exact positions of respective marks by beam scanning of these marks, rather than by execution of process treatments. Thus it is possible to obtain the intended GMC coefficients and correction map at higher speeds than the prior art. This makes it possible to speed up and accelerate the calculation of approximation equation coefficients while at the same time updating previous coefficients within a decreased length of time period. Thus it is possible to periodically update the data in DB unit 109 at short time intervals, thereby enabling successful execution of ULSI circuit pattern writing on target mask surface at inplane positions with increased accuracy.

Embodiment 2

Figure 12:
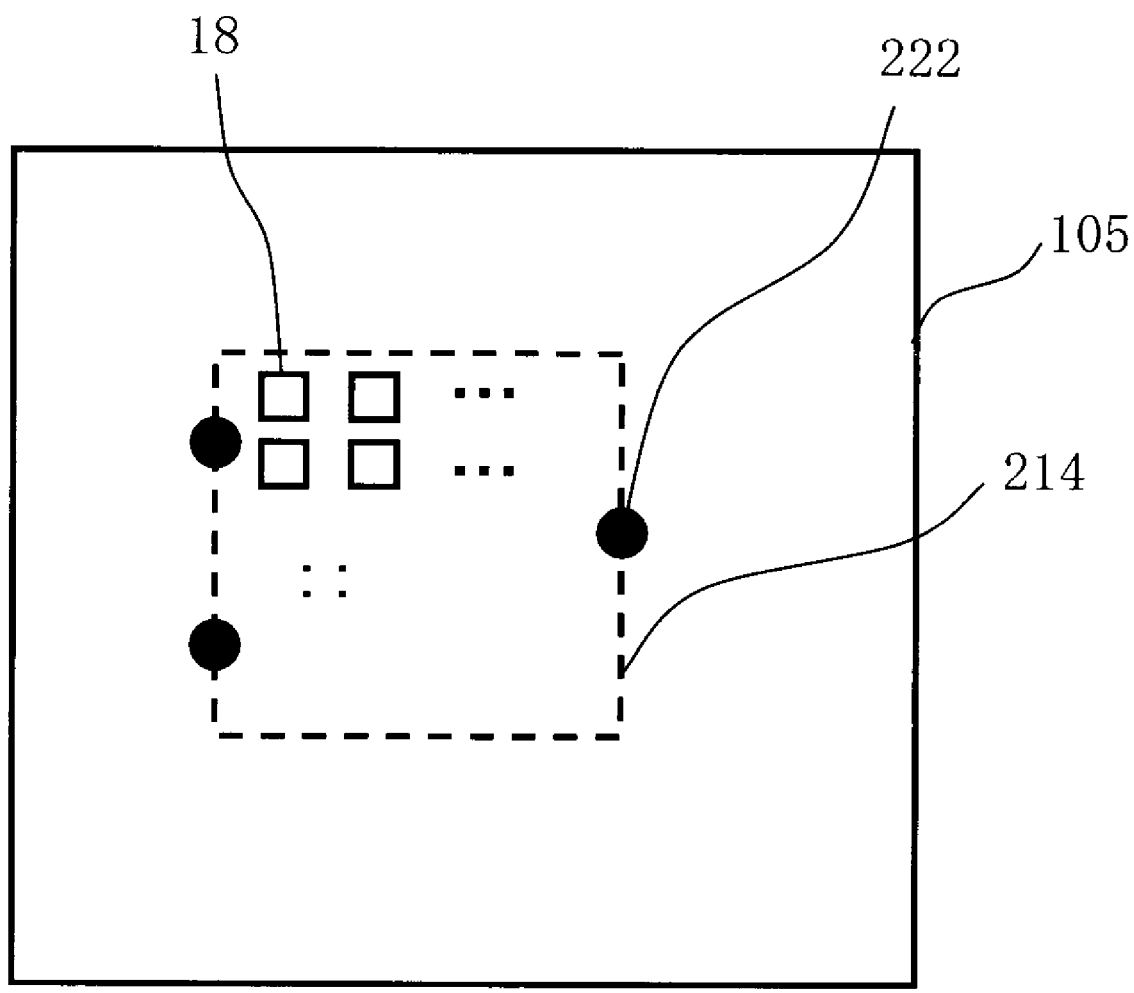
FIG. 12 is a top plan view of XY stage used in another lithography apparatus also embodying the invention.

A top plan view of another XY stage 105 for use in EB tool also embodying the invention is shown in FIG. 12. This XY stage design is similar to that shown in FIG. 3, with the mask layout position 214 being modified to be the same in position as the stage mount area of a photomask 101 under fabrication and also with a matrix of rows and columns of equally spaced position marks 18 being formed within the area of mask layout position 214. These marks 18 are laid out to cover almost the entire surface area corresponding to the circuit pattern writing region of mask 101. Covering the entire area enables successful measurement of the amount of a position-dependent positional deviation or offset at any location on the surface.

Figure 13:
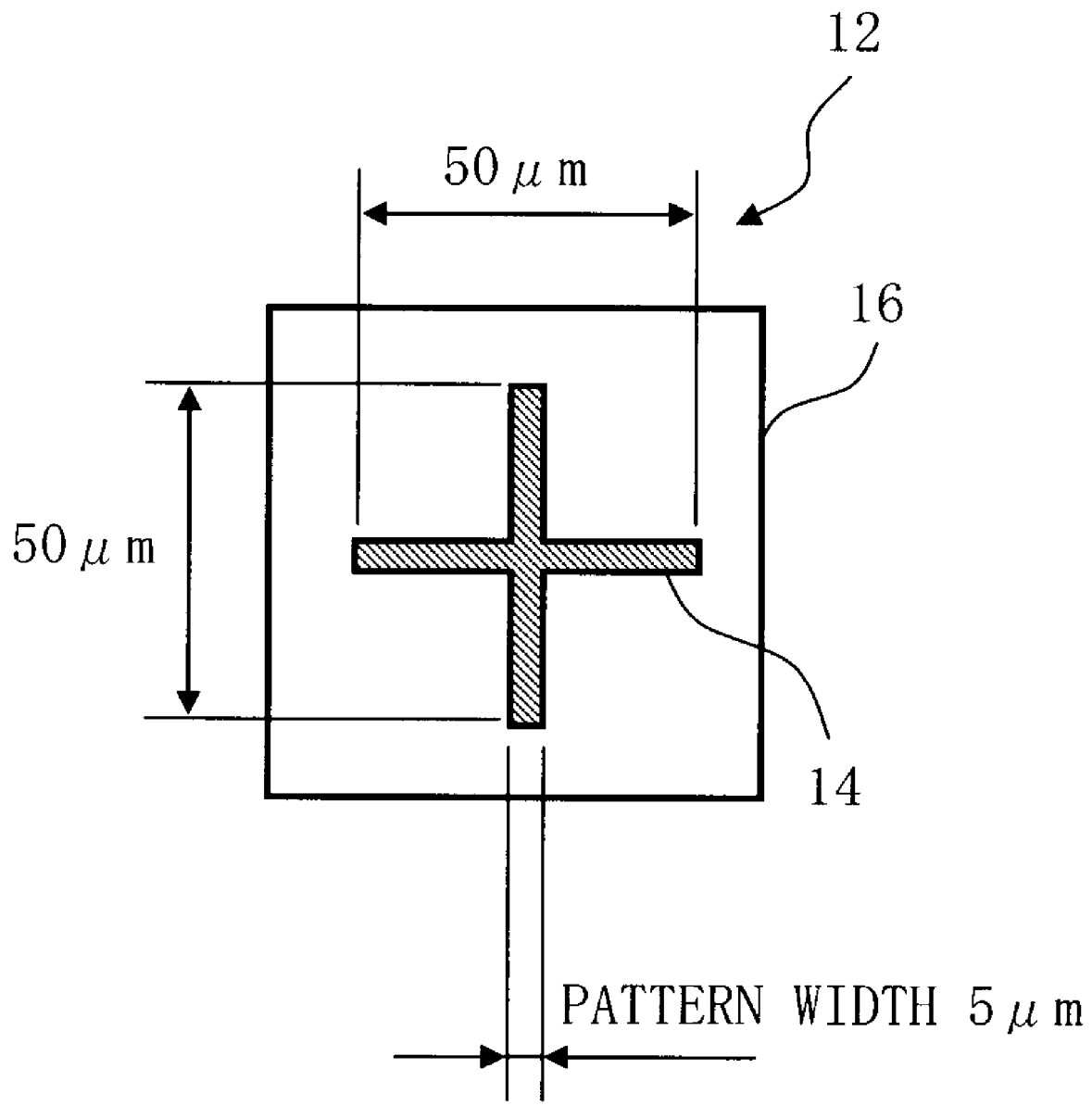
FIG. 13 shows a position mark in the another embodiment lithography apparatus.
Figure 14:
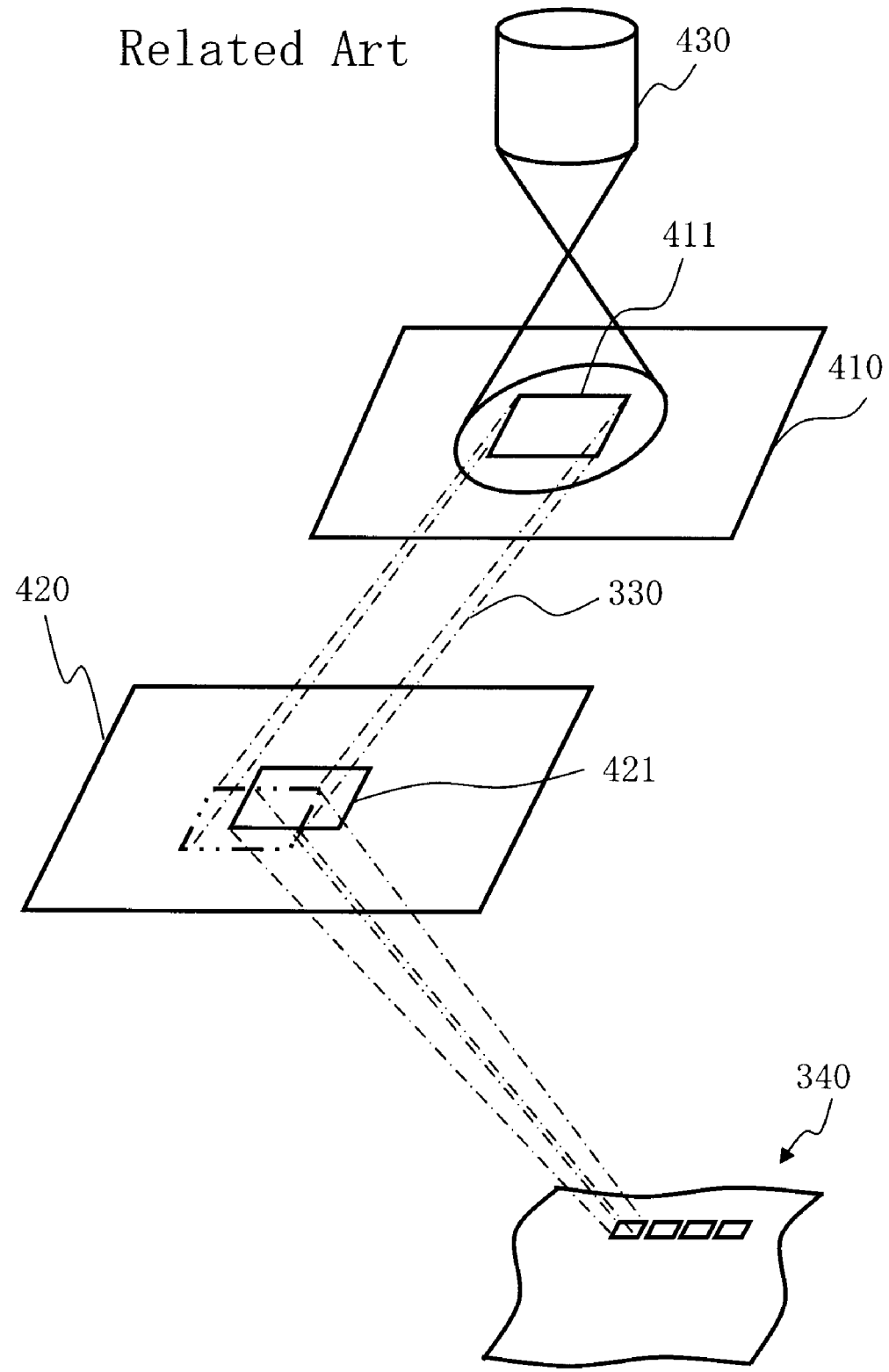
FIG. 14 is a schematical perspective view of main part of optics in prior known variable-shaped electron beam lithography apparatus.
Figure 15:
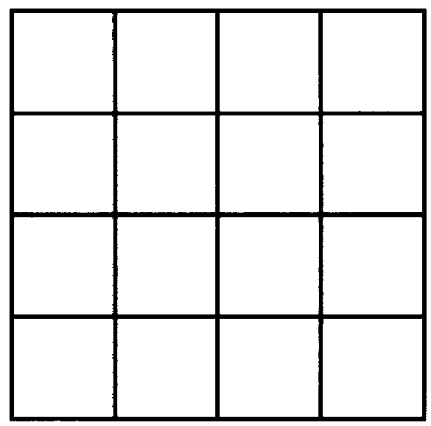
FIG. 15 shows a with-time change or "aging" of the orthogonality of a mesh-like pattern of circuit image write positions in the prior art.
Figure 15:
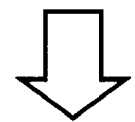
Figure 15:
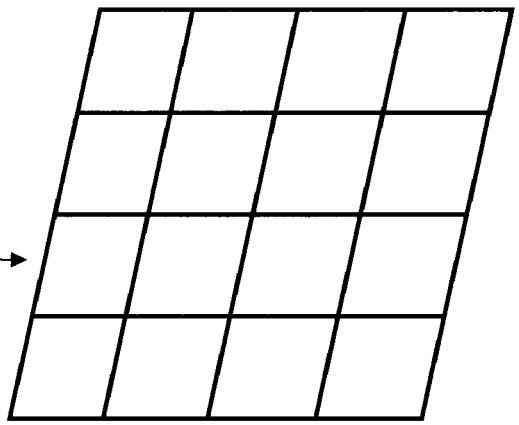
Figure 15:
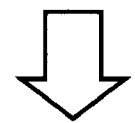
Figure 15:
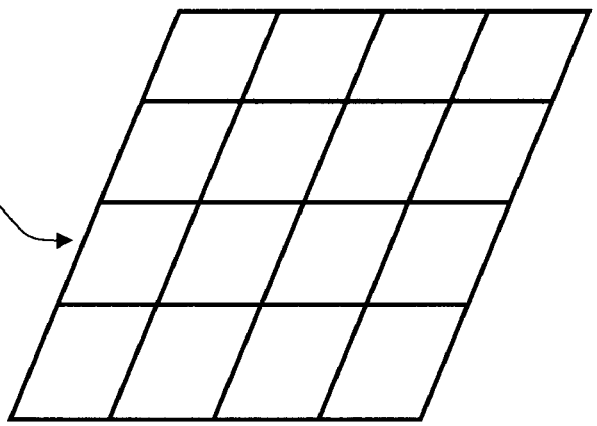
Figure 16:
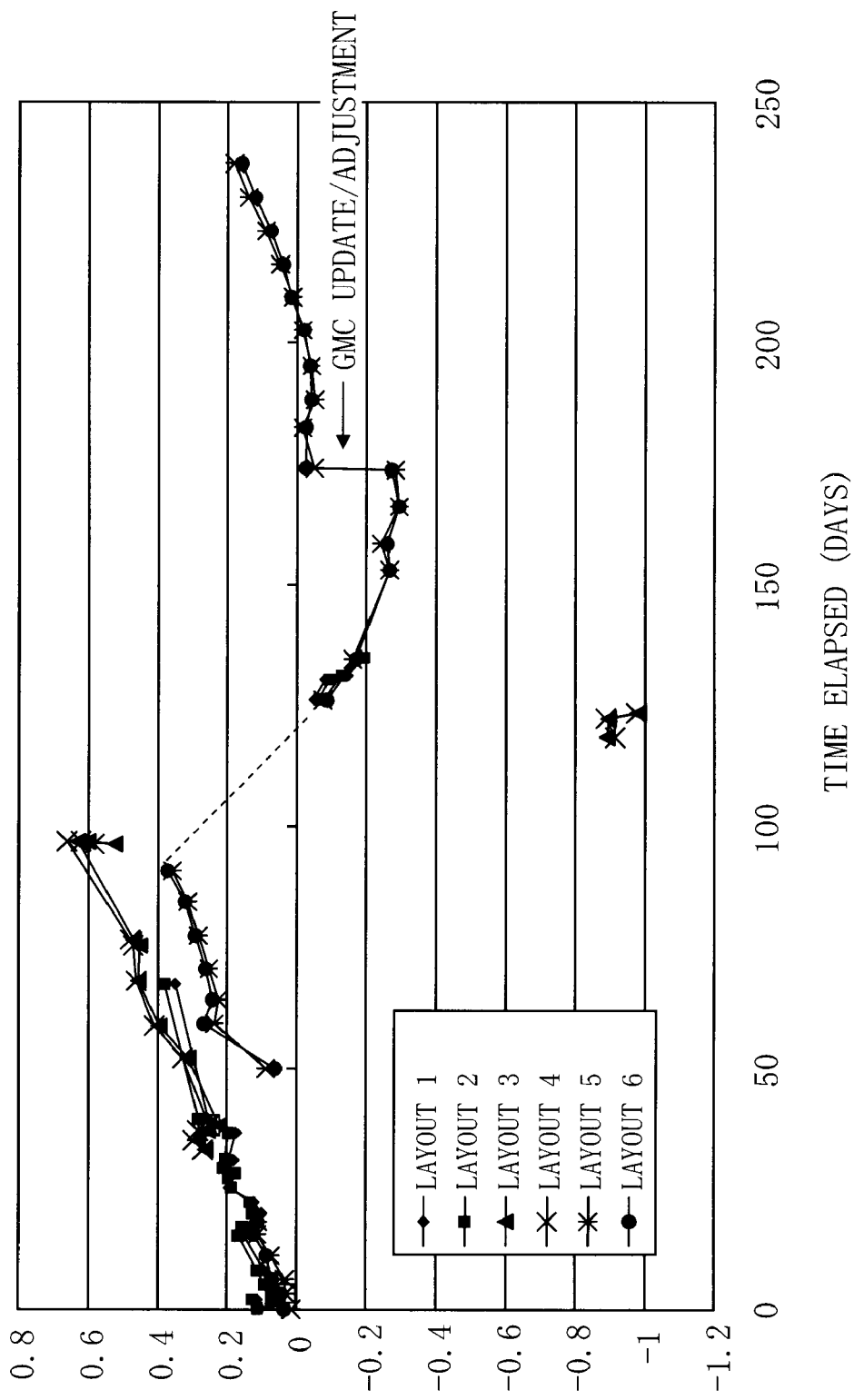
FIG. 16 is a graph showing an aging change of the orthogonality with elapsed days in the prior art.

An enlarged plan view of one of the position marks 18 for use in this embodiment is shown in FIG. 13. This position mark 18 is structured from a rectangular or square base layer 16 made of silicon (Si) having a cross-like pattern 14 formed thereon. This cross pattern is 5 μm in width and 50 μm in length of upright and transverse bars. Obviously these size values are not limitative ones and are modifiable on a case-by-case basis. Such position marks 18 are regularly laid out within an overall area of the region corresponding to the pattern write area of mask 101.

A distinguishing feature of this embodiment over the previous embodiment is that the array of position marks 18 is formed directly on the surface of XY stage 105 in place of the half-etch substrate 20 shown in FIG. 3. By performing beam-scanning measurement of the positions of respective cross marks 14 within such multiple position marks 18, the approximation equation coefficients are calculated for updating, with correction map preparation being done. Regarding other EB tool configurations, GMC-coefficient calculation, correction map creation and pattern writing operations, this embodiment is similar to the embodiment stated supra.

As apparent from the foregoing description, by performing the scanning of each mark 14 at the same position as the mask layout position 214 at which the mask 101 under fabrication is disposed, it becomes possible to much reduce errors occurrable depending on surface positions of XY stage 105 when compared to the case of the previous embodiment using the half-etch substrate 20 being laid out at a different location. In addition, forming the marks on XY stage 105 makes it possible to avoid troublesome works for carrying and loading/unloading a substrate to be measured. This contributes shortening of a time as taken for such loading/unloading processes. Although in the example of FIG. 12 also those components other than the essential parts to the description of the embodiment are eliminated from the illustration herein, this should not be interpreted to eliminate additional use of other known associative parts or components.

While the invention has been described with reference to specific embodiments, the description is illustrative of the invention and is not to be construed as limiting the invention.

Although those components which are deemed not to be directly relevant to the explanation of this invention, such as apparatus configurations and drive/control techniques, any appropriate hardware arrangements and control schemes are selectively employable on a case-by-case basis. For example, a detailed description is eliminated as to the configuration of the control unit for controlling the EB tool 100, this unit is designable by technicians in various ways to employ any adequately selected configurations.

As for other points, any possible charged-particle beam lithography methods and systems and charged-particle beam position correction coefficient computation/updating methods, which are modifiable by those skilled in the art without requiring inventive activities, should be interpreted to be included within the scope of this invention.

Additional advantages and modification will readily occur to those skilled in the art. Therefore, the invention in its broader aspects is not limited to the specific details and representative embodiments shown and described herein. Various modifications may be made without departing from the spirit or scope of the general inventive concept as defined by the appended claims and their equivalents.

What is claimed is:

1. A charged particle beam lithography apparatus comprising:
    an irradiation unit operative to irradiate a charged particle beam;
    a deflector operative to deflect the charged particle beam;
    a stage disposing thereon a workpiece for pattern writing and a substrate with a plurality of marks being regularly laid out in an entire area substantially equal to a pattern writing region of the workpiece, said substrate being disposed at a position on the stage different from a position of said workpiece on the stage;
    a measurement unit operative to measure positions of the plurality of marks on said stage through scanning of the charged particle beam by said deflector;
    a coefficient calculation unit operative to use an equation of approximation for correction of a position deviation occurring due to a hardware configuration of the apparatus to perform fitting of a deviation amount of the position of each mark by a coordinate system of said apparatus to thereby calculate more than one coefficient of the approximation equation with the fitting applied thereto; and
    a storage unit operative to perform overwrite storing whenever said coefficient calculation unit calculates said coefficient.

2. The apparatus according to claim 1, wherein said substrate has a film formed to have on its surface a pattern of projections corresponding to said marks being formed thereon.

3. A charged particle beam lithography apparatus comprising:
    an irradiation unit operative to irradiate a charged particle beam;
    a deflector operative to deflect the charged particle beam;
    a stage disposing thereon a workpiece for pattern writing and a plurality of marks being regularly laid out in an entire area substantially equal to a pattern writing region of the workpiece and disposed at a position on the stage different from a position of said workpiece on the stage, said plurality of marks being preformed on a surface of said stage;
    a measurement unit operative to measure positions of the plurality of marks on said stage through scanning of the charged particle beam by said deflector;
    a coefficient calculation unit operative to use an equation of approximation for correction of a position deviation occurring due to a hardware configuration of the apparatus to perform fitting of a deviation amount of the position of each mark by a coordinate system of said apparatus to thereby calculate more than one coefficient of the approximation equation with the fitting applied thereto; and
    a storage unit operative to perform overwrite storing whenever said coefficient calculation unit calculates said coefficient,
    wherein said deflector deflects the charged particle bean at a position on said workpiece corrected by using said coefficient calculated by using said plurality of marks disposed at the position on the stage different from that of said workpiece.

4. A position correction coefficient calculation method of a charged particle beam lithography apparatus for calculating more than one coefficient of an approximation equation used to correct a position deviation occurring due to a hardware configuration of the lithography apparatus, said method comprising:
    scanning using a charged particle beam a plurality of marks regularly disposed in an entire area equivalent to a pattern writing region of a workpiece for pattern writing on a stage, said plurality of marks being disposed at a position on the stage different from a position of said workpiece on the stage and being preformed on a surface of said stage; and
    performing fitting of a position deviation amount of each scanned mark by a coordinate system of the lithography apparatus to thereby calculate more than one coefficient of the approximation equation with the fitting applied thereto and then outputting the coefficient calculated for correcting a position on said workpiece.

5. A position correction coefficient updating method of a charged particle beam lithography apparatus for updating more than one coefficient of an approximation equation being stored in a storage device, the coefficient being for correction of a position deviation occurrable due to a hardware configuration of the lithography apparatus, said method comprising:
    scanning using a charged particle beam a plurality of marks being regularly disposed in an entire area corresponding to a pattern writing region of a workpiece for pattern writing on a stage, said plurality of marks being disposed at a position on the stage different from a position of said workpiece on the stage and being preformed on a surface of said stage;
    performing fitting of a position deviation amount of each scanned mark by a coordinate system of the lithography apparatus to thereby calculate more than one coefficient of the approximation equation with the fitting applied thereto; and
    overwriting the calculated coefficient on a previously defined coefficient being stored in said storage device for correcting a position on said workpiece.

6. The method according to claim 5, further comprising: periodically updating said coefficient once per time period shorter than six (6) months.

* * * * *